United States Patent [19]
Hays

[11] Patent Number: 5,396,189
[45] Date of Patent: Mar. 7, 1995

[54] ADAPTIVE FEEDBACK SYSTEM

[75] Inventor: Lyman V. Hays, Thousand Oaks, Calif.

[73] Assignee: Westech Group, Inc., Westlake Village, Calif.

[21] Appl. No.: 102,089

[22] Filed: Aug. 3, 1993

[51] Int. Cl.$^6$ ............................................. H03F 1/34
[52] U.S. Cl. .................................... 330/149; 330/136
[58] Field of Search ................ 330/85, 107, 109, 129, 330/136, 149

[56] References Cited

U.S. PATENT DOCUMENTS

| | | | |
|---|---|---|---|
| 4,276,514 | 6/1981 | Haung | 330/149 |
| 4,532,478 | 7/1985 | Silagi | 330/151 |
| 4,929,906 | 5/1990 | Voyce et al. | 330/149 |
| 5,126,687 | 6/1992 | Onoda et al. | 330/136 X |
| 5,148,117 | 9/1992 | Talwar | 330/151 |
| 5,155,448 | 10/1992 | Powell | 330/149 |
| 5,157,345 | 10/1992 | Kennington et al. | 330/149 |
| 5,157,346 | 10/1992 | Powell et al. | 330/151 |
| 5,172,071 | 12/1992 | Braathen | 330/129 |
| 5,175,879 | 12/1992 | Ellingson et al. | 455/126 |

FOREIGN PATENT DOCUMENTS

56-114406  2/1980  Japan.
55-112011  8/1980  Japan.

Primary Examiner—Steven Mottola
Attorney, Agent, or Firm—Irell & Manella

[57] ABSTRACT

An adaptive feedback system provides a means and method for removing selected signals from the feedback path, for compensating for changes in electrical characteristics of the feed forward and feedback paths so as to maintain negative feedback, and for prevention of closed-loop oscillation. Application to the suppression of amplifier distortion is emphasized. Cancellation techniques are employed to remove the desired output signal from the feedback path leaving only distortion to be negatively fed back. By this means, in-band distortion such as intermodulation products and noise can be suppressed without reduction in effective amplifier gain. Adaptive feedback compensation is used to assure negative feedback of a selected spectral band even when transfer characteristics of the forward and/or feedback paths vary due to such factors as changing input-signal parameters, component value drift due to environmental conditions, etc. Adaptive feedback compensation is achieved by either insertion and subsequent cancellation of a reference signal in the feedback path or by amplitude minimization of all fed back signals.

32 Claims, 6 Drawing Sheets

INPUT   OUTPUT

ADAPTIVE FEEDBACK SYSTEM

FIELD OF THE INVENTION

This invention relates generally to feedback systems and specifically to those systems used to suppress undesired distortion generated by devices such as amplifiers.

BACKGROUND OF THE INVENTION

Amplification of signals frequently involves a trade off between linearity and such factors as power consumption, thermal efficiency, cost, size, etc. Traditional amplifier design achieves linear operation at the expense of power efficiency; class A is a good example of high linearity combined with poor efficiency. Improved power efficiency is usually achieved through the use of class AB, B, and C amplifier designs but at the expense of linearity. However, in recent years new techniques have been developed which improve linearity of these designs using feed-forward cancellation of undesired amplification artifacts (distortion). These techniques enable the design of amplifiers having both good linearity and efficiency and, as such, are particularly useful in high power applications such as the radio tv broadcasting industry and in limited power applications such as satellite transponders. While feed-forward cancellation does provide significant advantages, the need continues for improved amplifier design techniques.

Numerous examples of feed-forward distortion cancellation are taught in the existing body of patents. U.S. Pat. No. 4,532,478 to Silagi (1985) is an early example wherein feed-forward cancellation is achieved via implementation of two loops. The first loop is around the amplifier to be linearized. Its purpose is to create a replica of the distortion generated by the amplifier by subtracting the input signal from a gain and phase normalized version of the distorted and amplified output signal. The second loop adjusts the amplitude and phase of the distortion output of the first loop and then subtracts it from the output of the amplifier. An error amplifier is required in the second loop in order to amplify the distortion to a level where it will be of sufficient amplitude to cancel the high level distortion generated by the main amplifier. Because the two loops in Silagi's patent are manually adjusted, any variations in input signal level and frequency and/or component values due to such factors as temperature and aging will tend to unbalance the loops and adversely effect the degree of distortion cancellation.

Newer feed-forward implementations such as those taught in U.S. Pat. No. 5,148,117 to Talwar (1992) employ methods of automatically balancing the two loops and thus compensating for changes in input signal parameters and environmental conditions. An error amplifier is still required in the second loop. The error amplifier must be highly linear and low noise or it will itself degrade the output signal. Such amplifiers typically operate in the inefficient class A mode to achieve the desired degree of linearity. The presence of the error amplifier can be costly in terms of power consumption, heat dissipation, size and dollars thus negating to some degree the gains achieved by employing feed-forward in the first place.

The need for a high-level error amplifier is eliminated if feedback techniques are employed instead to suppress distortion. It is well known that negative feedback will decrease certain types of distortion; however, the instantaneous bandwidth over which such improvement can be realized is limited by loop gain and the accumulated phase shift of the loop. Stable feedback loop design places stringent requirements on loop phase and gain characteristics.

U.S. Pat. No. 4,276,514 to Huang (1981) discloses a feedback technique in which an amplitude adjusted sample of the amplifier output is subtracted from a phase adjusted sample of the input signal. The resultant is then passed through a bandpass filter and a delay equalizer then summed into the amplifier input via gain and phase adjusting networks. Huang attempts to broaden usable loop bandwidth by incorporation of a SAW delay equalizer in the feedback path. However the general utility of such an approach is limited in that addition of any network inserted into the feedback path will increase time delay and thus narrow usable loop bandwidth. As with Silagi, no provisions are made for automatic adjustment of loop phase or amplitude.

In U.S. Pat. No. 4,929,906 to Voyce and McCandless (1990) a method of achieving linearization of rf amplifiers over a wide loop bandwidth is taught. Use is made of down/up conversion in order to lower the frequency at which the feedback loop operates. The input signal is first down-converted to some convenient lower frequency and then passed to the feedback loop summing junction. It then passes through an IF filter and an up-converter before reaching the amplifier input. A sample of the amplifier output is directly fed back to the loop summing junction via a second down converter. A key feature of the Voyce and McCandless patent lies in that as the summing frequency is lowered, loop implementation is in general simplified. However, forward gain of the amplifier is reduced by the feedback and no provision is made for automatic adjustment of the loop phase shift.

SUMMARY OF THE INVENTION

The term "distortion" as used herein refers to any signals present at the output of device which were not present at its input. Distortion may include such unwanted signals as noise, intermodulation distortion, harmonics, and so on. The term "desired signal" as used herein refers to the signal or signals which the device is intended to pass and, depending on context, will refer to either signals at the input or output of the device. And the term "in-band" as used herein refers to a frequency band sufficiently wide to pass the input signal.

The adaptive feedback system described herein provides a means and method for selectively removing undesired signals from the feedback path and/or compensating for changes in the electrical characteristics of the forward and feedback paths. While application of the adaptive feedback system to the suppression of amplifier distortion is emphasized herein, the method and apparatus are not limited to this particular application and can be applied to closed-loop control systems in general.

It is well known that negative feedback around an amplifier can be utilized to reduce the amount of distortion in the amplifier output. Non-frequency-selective negative feedback, using resistive feedback elements for example, will reduce amplifier gain and tend to reduce all amplifier output including both distortion and the desired signal. This reduction of gain with respect to the desired signal is often an unwanted byproduct of negative feedback. Alternately, if only signals which do not include the desired signal are fed back, then the undesired signals (distortion) will be suppressed without reducing effective amplifier gain. Frequency-selective feedback networks can be used to keep the desired signal out of the feedback path but practical limitations of such filtering will not generally permit useful suppression of in-band distortion. This problem can be overcome by applying a first aspect of the adaptive feedback system which teaches a method and apparatus whereby the desired signal is removed from the feedback path leaving only distortion to be fed back and thus suppressed. A further problem with conventional feedback techniques is that they generally utilize feedback networks having fixed characteristics and thus cannot adequately compensate for changes in the electrical characteristics of the feed forward and feedback loops due to such factors as changing signal parameters, component value drift due to environmental conditions, etc. Therefore a second aspect of the adaptive feedback system teaches a method and apparatus whereby negative feedback is assured by incorporation of adaptive phase compensation into the feedback path.

Accordingly several objects and advantages of the present invention are:
- to provide a method for automatic elimination of selected signals from the feedback path of closed-loop systems;
- to provide a method which automatically assures negative feedback of selected spectral bands in closed loop systems;
- to provide an apparatus for the selective suppression of distortion generated by devices such as amplifiers which overcomes the inherent disadvantages of known feed-forward and feedback methods and apparatus;
- to provide a distortion suppression apparatus which eliminates the need for manual adjustment;
- to provide a distortion suppression apparatus which yields unconditionally stable closed-loop operation.

Further objects and advantages include provision to accommodate multiple input signals, provision to track rapidly varying conditions such as frequency hopping signals using intermediate frequency techniques, and flexible loop design achieved by use of multiple feedback networks. Still further objects and advantages will become apparent from a consideration of the ensuing description and drawings.

BRIEF DESCRIPTION OF THE DRAWINGS

In the drawings, closely related figures have the same number but different alphabetic suffixes. All figures except FIG. 4B are functional block diagrams. Primes as used in the figure reference numbers denote that the indicated element performs a similar, but not necessarily identical, function to the element having the same but unprimed number. For example, the two filters of FIG. 1C may have different center frequencies.

DETAILED DESCRIPTION OF THE PREFERRED EMBODIMENTS

Figure 1A:
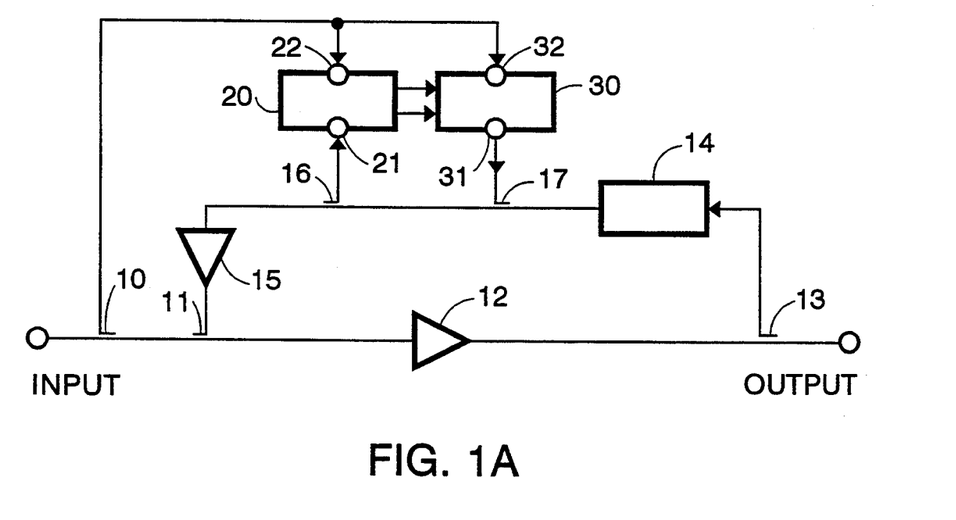
FIG. 1A shows a basic form of the adaptive feedback system which eliminates the desired signal from the feedback path by means of signal cancellation thus permitting suppression of in-band amplifier distortion in accordance with a first aspect of the present invention.
Figure 2A:
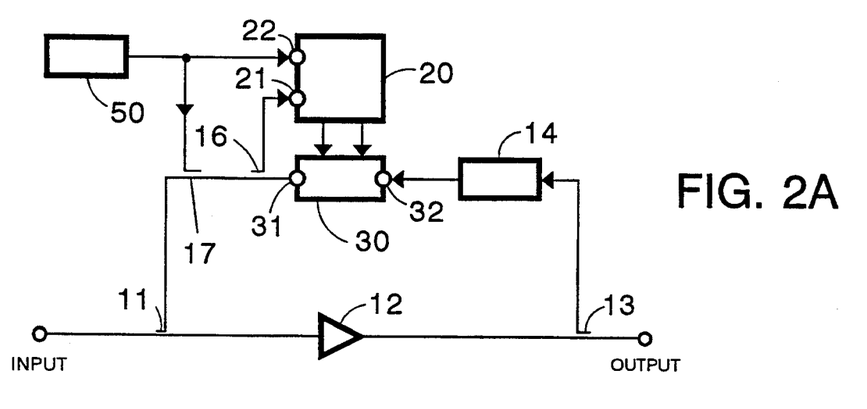
FIG. 2A shows a basic form of the adaptive feedback system which automatically adjusts phase of the feedback path thus assuring suppression of a selected spectral band in accordance with a second aspect of the present invention.

Basic embodiments of the first and second aspects of the adaptive feedback system are illustrated in FIG. 1A and FIG. 2A respectively. While an amplifier is used to exemplify the concepts, the method and apparatus can be applied to distortion generating apparatus in general. Although the two aspects of the present invention are separately illustrated, it will be appreciated that one skilled in the art can readily combine these aspects in many different alternative feedback configurations. A few of these alternative configurations have been included in the following figures to illustrate the wide application of the adaptive feedback system.

The preferred embodiment of the first aspect of the adaptive feedback system as illustrated in FIG. 1A will substantially remove the desired output signal from the feedback path using signal cancellation techniques. By this means, in-band distortion such as intermodulation products and noise, for example, can be suppressed without reduction in effective amplifier gain. Element 12 is the amplifier which generates the unwanted distortion and is not part of this invention per se. Elements 11 through 14 comprise a conventional feedback configuration wherein output of amplifier 12 is selectively fed back to its input via output coupler 13, feedback network 14 and feedback coupler 11. Negative feedback is achieved through the combined phase shift of elements 11 through 15. The remaining elements of FIG. 1A provide the requisite cancellation of the desired signal in the feedback path.

Vector detector 20 and vector controller 30 are configured so as to introduce a phase and amplitude adjusted replica of the desired input signal into the feedback path such that the desired signal is canceled and thus removed from the feedback path. Input coupler 10 provides a sample of the desired input signal to vector detector 20 and vector controller 30. This sample is referred to as the reference signal. Couplers provide a means to combine or divide signals, as appropriate, and may, for example, take the form of directional couplers, summers, splitters, active devices, etc. Couplers 10, 13, and 16 serve to split their single input signal into two or more output signals; while couplers 11 and 17 serve to combine two or more input signals into a single output signal. Combination or division of signals within a given coupler is not necessarily in equal proportions. For example, output coupler 13 will usually be configured to route only a small sample of the desired output signal to the feedback path. Feedback network 14 must, as a minimum, pass those portions of output frequency spectrum containing the distortion to be suppressed. Many other factors, such as closed-loop stability, may influence design of feedback network 14. In the following discussion, feedback network 14 is assumed to be a bandpass filter although it may take other forms or, in some cases, be eliminated entirely. Feedback network 14 is shown preferably located between output coupler 13 and vector controller 30 but, depending on the function it is to perform, the network might be located elsewhere in the feedback path or might even be split into several portions located in several different parts of the feedback path. Effective cancellation of the desired signal in the feedback path can only be accomplished if the level of the cancellation signal being introduced into the feedback path via coupler 17 is substantially equal to that of the signal to be canceled. Therefore the level of the reference signal at input terminal 32 must exceed that of the signal to be canceled by at least the combined attenuation of vector controller 30 and coupler 17. This requirement can be met either by amplifying the reference signal somewhere prior to coupler 17 or by introducing attenuation into the feedback path prior to coupler 17. Reference signal amplification can introduce additional distortion into the feedback path if the reference signal amplifier is not sufficiently linear. The preferred method is to introduce attenuation into the feedback path via either the feedback network 14 or output coupler 13, or both. Feedback amplifier 15 may then be required to compensate, at least in part, for this added attenuation so that adequate feedback gain is available to suppress the fed back distortion.

The vector detector 20 and vector controller 30 of FIG. 1A have as their inputs the reference signal provided by input coupler 10. The output of vector controller 30 on terminal 31 is introduced into the feedback path via coupler 17; it is simply a phase and amplitude adjusted replica of the reference signal having substantially the same amplitude of but in phase opposition to the sample of desired output signal being fed back from output coupler 13 via feedback network 14. The purpose of vector detector 20 is to determine the required phase and amplitude adjustments and to pass this information to vector controller 30. Vector detector 20 accomplishes this task by comparing the phase and amplitudes of its two inputs. The input on terminal 22 is the same reference signal which feeds controller 30. While the input on terminal 21 consists of a sample of the feedback signal obtained via coupler 16; this signal is referred to as the error signal. Vector detector 20 searches for correlation between its reference and error input signals. One or more control signals (usually two) are derived from this process and used to control the amount of phase and amplitude adjustment provided by vector controller 30 in such a manner as to minimize correlation between the reference and error signals. Correlation reaches a minimum when the signal on output terminal 31 is of the correct amplitude and phase to cancel the desired signal and in so doing to force the amplitude of the desired signal component of the error signal to approximately zero. The final result of the cancellation loop thus formed is to automatically minimize the amount of desired signal being fed back to the input of amplifier 12.

Figure 3A:
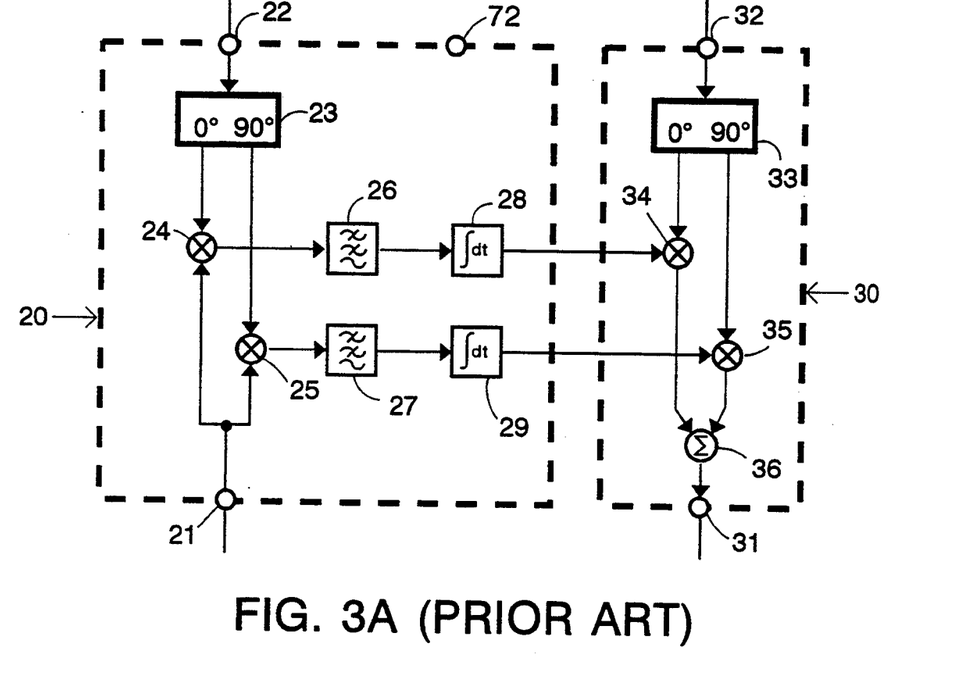
FIG. 3A shows in some detail a rectangular form of correlation vector detector/controller.
Figure 3B:
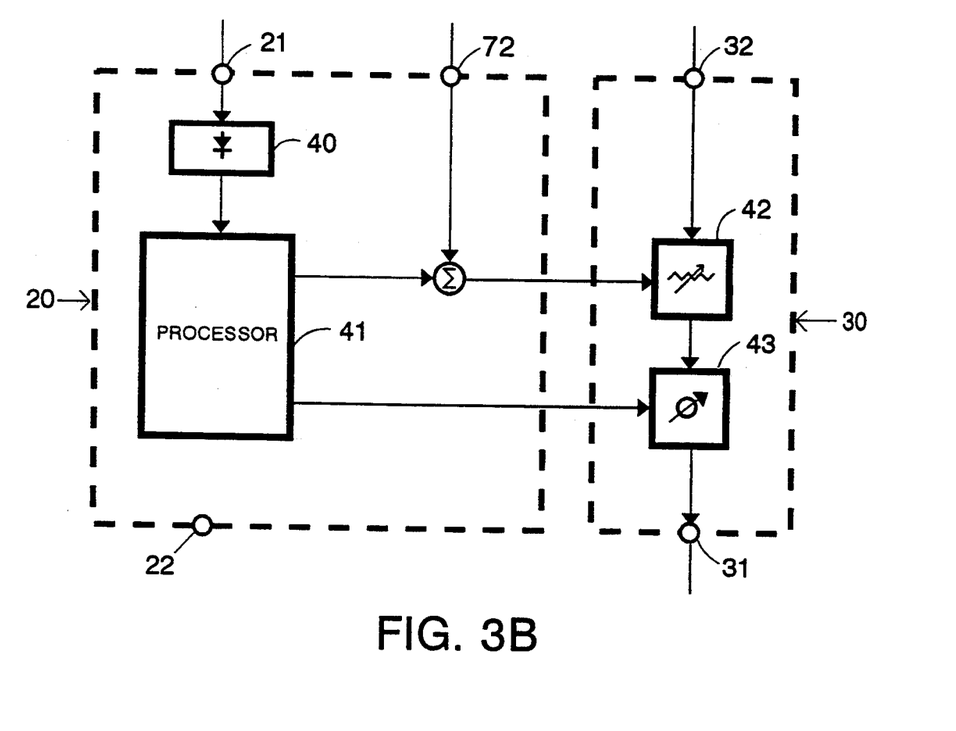
FIG. 3B shows in some detail a polar form of level-detection vector detector/controller.

Vector detectors and controllers are well known. Suitable vector detectors and controllers are disclosed, for example, in U.S. Pat. Nos. 5,148, 117 to Talwar (1992) and 5,157,345 to Kennington et al. (1992). A preferred embodiment using rectangular-coordinate techniques, commonly referred to as an interference canceler, is illustrated in FIG. 3A. In this particular embodiment of vector detector 20, the error signal on input terminal 21 is synchronously detected using the reference signal on input terminal 22. Quadrature detection is used to separate the error signal into in-phase (I) and quadrature-phase (Q) components via quadrature hybrid 23 and mixers 24 and 25. The mixing process generates both sum (double frequency) and difference (baseband) signals. Low pass filters 26 and 27 serve to pass only the baseband signals onto the amplifier/integrators 28 and 29. These baseband signals represent the instantaneous amplitude and polarity of the I and Q components of the error signal. Integration of I and Q yields the control signals which are used by vector controller 30. The purpose of vector controller 30 is to modify the amplitude and/or phase of the signal passing through it from input terminal 32 to output terminal 31 in accordance with the control signals provided by vector detector 20. The reference signal on input terminal 32 is separated into quadrature components via quadrature hybrid 33. These quadrature components are then passed through bi-phase attenuators 34 and 35 which serve to independently adjust amplitude of the two quadrature components in response to the level of the control signals provided by vector detector 20. Bi-phase attenuators 34 and 35 can invert signal phase as a function of their control signal polarity; double-balanced mixers are commonly used for this purpose. Control signal polarity is initially setup such that bi-phase attenuators 34 and 35 will be adjusted to achieve minimum correlation between the output signal on terminal 31 and the reference signal on terminal 22. While this preferred embodiment utilizes rectangular analog techniques, equally suitable vector detectors and controllers can be implemented utilizing well known digital and/or polar techniques; FIG. 3B illustrates a polar implementation.

It will be appreciated that although vector detectors and controllers can be implemented using known techniques, the present invention represents a significant departure from prior art in their use to remove signals from the feedback path of a control loop. For example the positioning of vector detector 20 and vector controller 30 in the feedback paths as illustrated in FIG. 1A and FIG. 2A is new.

Figure 1B:
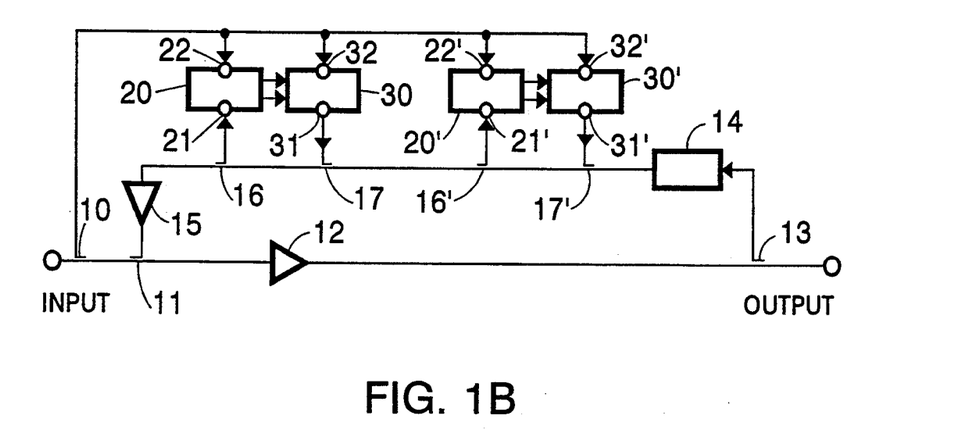
FIG. 1B shows a variation of FIG. 1A in which improved cancellation of the desired signal within the feedback path is achieved.

The ratio of distortion to desired-signal at the feedback input to feedback coupler 11 must be large in order to achieve distortion suppression without reducing the effective gain of amplifier 12 with respect to the desired signal. In practice the technique illustrated in FIG. 1A can readily reduce the amplitude of the desired signal in the feedback path by 30 to 50 dB. However if the amplitude of the "fed back" desired signal, after cancellation, is not significantly less than that of the distortion, additional stages of cancellation can be cascaded as necessary to achieve the required degree of cancellation. FIG. 1B illustrates an embodiment employing two stages of cancellation.

Figure 1C:
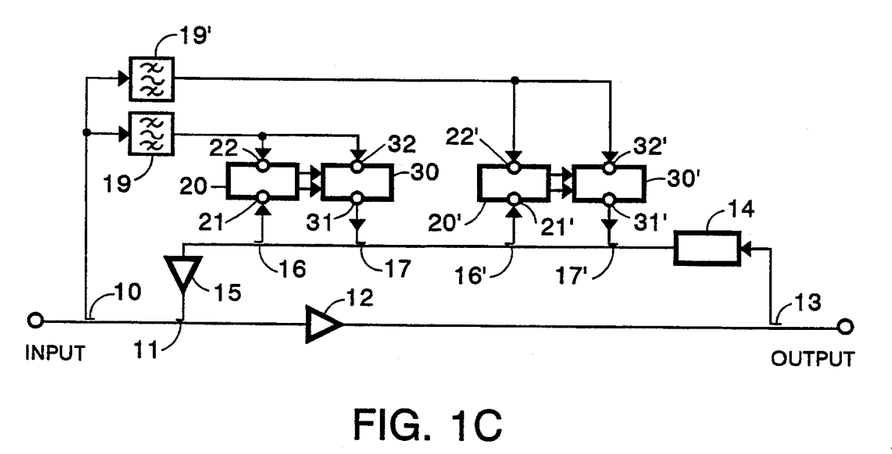
FIG. 1C shows a variation of FIG. 1A in which selected components of the desired signal are canceled within a single feedback path.
Figure 1D:
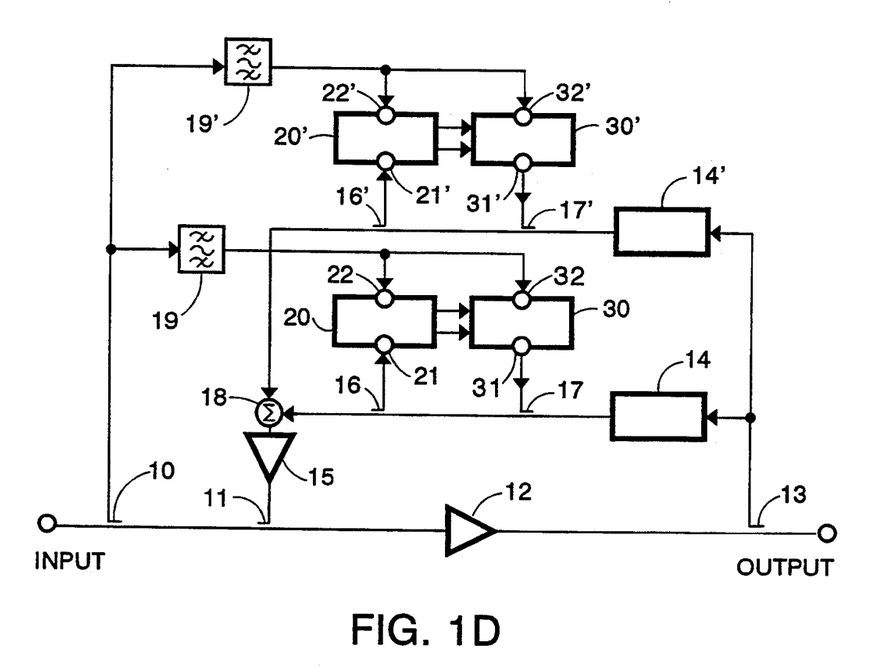
FIG. 1D shows a variation of FIG. 1A employing multiple feedback loops in which selected components of the desired signal are canceled.

FIGS. 1C and 1D illustrate embodiments wherein the desired input signal is composed of two signal channels separated in frequency but arriving on a common input line. Although the concepts are illustrated using two signal channels, they apply equally well to a plurality of channels. Filters 19 and 19' are included to separate the two signal channels so they can serve as independent reference signals for use by their respective vector detector/controllers. Bandpass filters are shown but they can instead be any circuit which derives independent reference signals from the desired input signal. Both signal channel components of the desired signal will be eliminated from the feedback path leaving any other signals passed by feedback network 14 to be fed back and thus suppressed. Independent feedback loops are employed in the embodiment illustrated in FIG. 1D. As with FIG. 1C, filters 19 and 19' separate the signal channels into two independent reference signals. Each feedback loop also requires its own feedback network 14 and 14'. These networks pass only one of the two signal channels. For instance feedback network 14 passes the signal channel passed by filter 19 but rejects that passed by filter 19'. Likewise feedback network 14' passes the same signal channel as 19' but rejects that passed by filter 19. Use of a common network filter would allow the signal channel canceled in one feedback path to be passed in the other path. The outputs of the two feedback paths are combined in summer 18 and then routed to feedback amplifier 15. Alternately, the two feedback paths can use separate feedback amplifiers whose outputs are then combined in summer 18. The embodiment of FIG. 1D is particularly useful when the signal channels are widely separated in frequency. Filters 19 and 19' are required to separate the signal channels since they arrive on a single input line; however, if each signal channel arrived instead on its own input line, then separate input couplers 10 and 10' can be used to sample the individual input lines prior to their being combined into a single input line and filters 19 and 19' can be eliminated.

A preferred embodiment of the second aspect of the adaptive feedback system is illustrated in FIG. 2A. The apparatus shown will assure negative feedback of a selected spectral band of the fed back signal even when transfer characteristics of the forward and/or feedback paths vary. Such variation might occur, for example, when input signal levels or environmental conditions change. This embodiment differs substantially from those previously discussed in that the adaptive feedback system of FIG. 2A acts to modify the transfer characteristics of the feedback path rather than to eliminate (cancel) a specific signal from the feedback path as is achieved per FIG. 1A. Placement of vector controller 30 in series with the feedback path enables adaptive control of both feedback phase and gain. This series placement is in contrast to that of FIG. 1A wherein controller 30 only serves to introduce a cancellation signal into the feedback path. As previously discussed, elements 11 through 14 comprise a conventional feedback configuration. Distortion suppression is achieved through negative feedback of those portions of amplifier 12 output spectrum containing the undesired distortion. Feedback network 14 serves to approximately define that portion of the output spectrum to be fed back and thus suppressed. The remaining elements 20, 30, and 50 provide the requisite control of feedback phase and gain. Reference generator 50 provides a reference signal used to identify precisely which spectral portion is to be suppressed. In certain situations it is possible to derive the reference signal directly from the desired input signal and thereby eliminate the reference generator 50. However, care must be exercised to insure that the reference signal is substantially uncorrelated with the desired signal as the presence of such correlation can result in a phase error being introduced into the feedback path.

The vector detector 20 and vector controller 30 of FIG. 2A perform as previously described in the discussion of FIG. 1A. But rearrangement of their inputs and outputs as shown in FIG. 2A achieves a new result. Vector detector 20 has as its inputs a sample of the fed back signal provided by coupler 16 and a reference signal supplied by reference generator 50. This same reference signal is also introduced into the feedback path via coupler 17. Vector detector 20 searches for correlation between the reference signal input on terminal 22 and the error signal input on terminal 21. And as previously discussed, the vector detector generates signals which control the amount of phase and/or gain adjustment provided by vector controller 30 so as to insure negative feedback and thus to minimize the amplitude of the error signal. In other words, the combined action of the vector detector/controller pair serves to insure that the total phase shift of the forward and feedback paths is approximately 180 degrees at the frequency of the reference signal. Thus the reference signal will be suppressed due to negative feedback and, more importantly, so will all other signals within a frequency band roughly centered on the reference signal frequency. The width of this frequency band is largely determined by the phase characteristics of feedback network 14. It is therefore possible to suppress any given spectral band of the output spectrum of amplifier 12 by simply setting the reference signal to that frequency.

Distortion suppression per FIG. 2A is illustrated in the following example. Assume a third harmonic of the desired input signal is to be suppressed. The reference generator 50 is tuned to approximately the frequency of the third harmonic. It is assumed that feedback network 14 is a bandpass filter which at least passes the third harmonic. Network 14 can additionally pass other portions of the output spectrum as long as it does not pass the fundamental of the desired signal; passage of the fundamental may result in suppression of the desired signal, unless of course the signal canceler of FIG. 1A is added to the feedback loop. Vector detector 20 synchronously detects the presence of the reference signal in the feedback path and thereby derives control signals for use by vector controller 30. These control signals direct vector controller 30 to shift the feedback phase so as to assure negative feedback for the reference signal and hence suppression of the third harmonic.

Figure 2B:
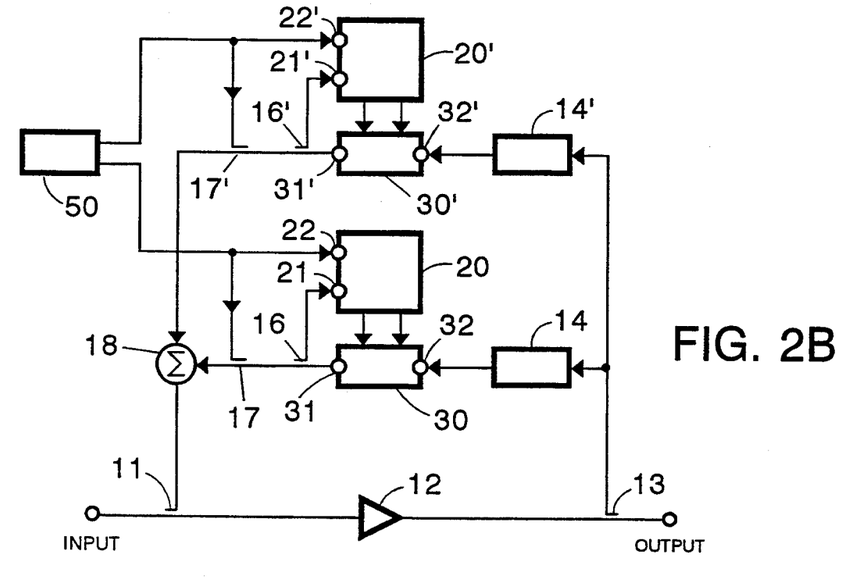
FIG. 2B shows a variation of FIG. 2A employing multiple feedback loops.

FIG. 2B illustrates a variation of FIG. 2A wherein adaptive feedback control is utilized in conjunction with two feedback loops; although only two loops are shown, the concept applies equally well to multiple feedback loops. Reference generator 50 produces two reference signals, each controlling an independent feedback path. This independence is actually a function of the frequency characteristics of feedback networks 14 and 14'. If these filters have no overlapping frequency ranges, then the feedback paths will be independent. Use of independent feedback paths permits considerable design flexibility.

Figure 2C:
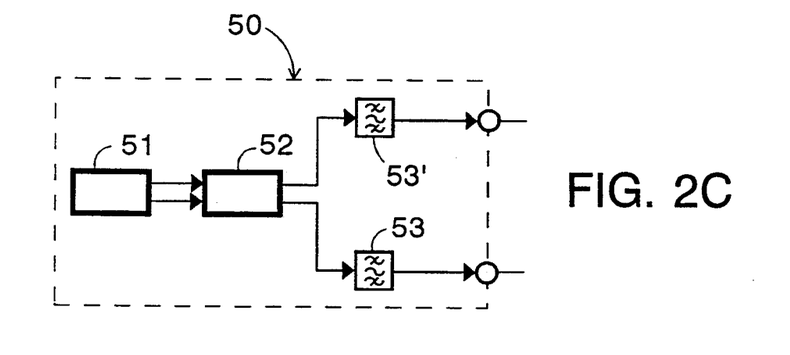
FIG. 2C shows one possible implementation of the reference generator.

FIG. 2C illustrates one form of reference generator 50 wherein two reference signals are generated from a common signal source. Such a configuration can be used, for instance, when the reference signals are harmonically related. To illustrate, assume the third and fifth harmonics of the desired input signal are to be suppressed using the embodiments shown in FIGS. 2B and 2C. Signal generator 51 is tuned to approximately the same frequency as the desired signal. Distortion generator 52 is assumed to generate odd harmonics. Elements 53 and 53' are bandpass filters tuned respectively to the third and fifth harmonics. Thus the primed feedback path suppresses the fifth harmonic while the unprimed path suppresses the third harmonic.

The adaptive control techniques discussed thus far have all incorporated some form of synchronous detection utilizing a reference signal. FIGS. 2A and 2B can instead be implemented with vector detectors using various well known non-synchronous methods. FIG. 3B illustrates one such alternative method employing a signal level detector. Detector 40 produces an output signal which is a function of the amplitude of the error signal input on terminal 21. The key to this implementation lies in the form of processor 41. Gradient search techniques can for example be employed by processor 41 to determine control signal settings which will result in minimization of the error signal. The associated vector controller 30 is shown implemented using polar coordinate control means although rectangular coordinates control means as in FIG. 3A are equally suitable. A significant advantage of non-synchronous detection techniques is the elimination of the need for a reference signal thus reference generator 50 can be dispensed with. An optional automatic-gain-control (AGC) signal is shown on terminal 72.

Figure 4A:
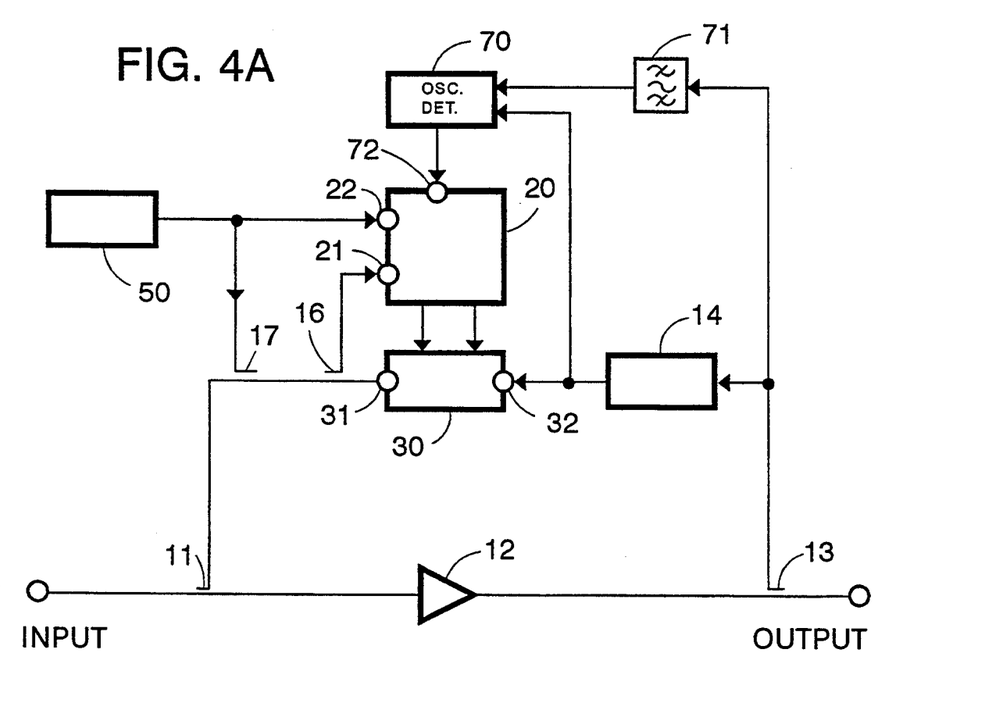
FIG. 4A shows a basic form of an oscillation prevention apparatus.

It is noteworthy that signal cancellation per FIGS. 1A through 1D require control of both phase and gain but only phase control is required to insure negative feedback per FIGS. 2A and 2B. When configured per FIG. 2A or 2B, the particular vector detector and controller design illustrated in FIG. 3A will tend to adjust feedback loop phase to achieve negative feedback and will in addition continue to increase feedback loop gain (or more accurately, decrease loss) until one of the following occurs: the error signal is minimized, the loop oscillates, or the limit of the vector controller's gain control range is reached. Loop oscillation can be prevented by use of closed-loop designs which are inherently stable or by incorporation of sufficient attenuation into one or more of the elements comprising the feedback path, in feedback network 14 for example. A third alternative, illustrated in FIG. 4A is to utilize the gain control capability of the vector controller in conjunction with an oscillation detection means to limit feedback loop gain to just below that which induces oscillation. Such an implementation will yield maximum distortion suppression but without inducing oscillation. Vector controllers utilizing polar coordinate techniques, such as depicted in FIG. 3B, are particularly suitable for use with automatic control of loop gain as they utilize a single control line to set amplitude. In the event gain control is not needed, one skilled in the art can employ other equally suitable detector and/or controller designs which provide only phase control.

Figure 4B:
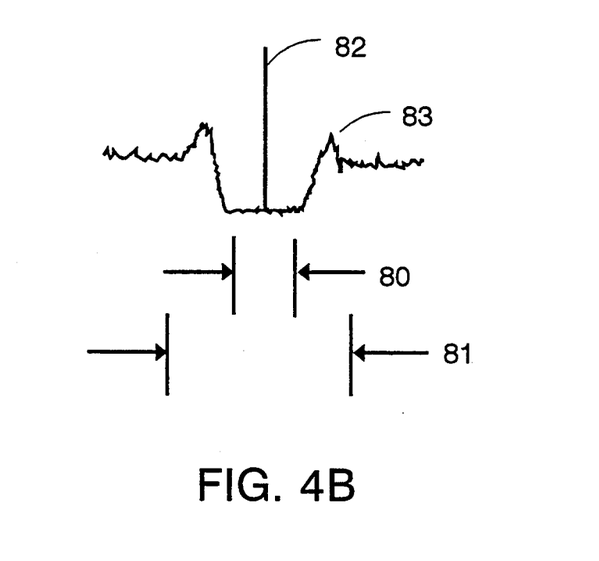
FIG. 4B shows typical amplifier output to illustrate bandwidth relationships of the filters in FIG. 4A.

The oscillation prevention design depicted in FIG. 4A is based on the premise that spectral peaking will occur at the band edges of feedback network 14 (assuming network 14 is a bandpass filter) just prior to the onset of oscillation. Other equally suitable oscillation detection techniques may be employed to generate the signal on input terminal 72 and still remain within the spirit of using automatic control of the loop gain to prevent oscillation. Although FIG. 3B shows the AGC function being implemented within the vector controller 30 via vector detector 20; in practice, the gain control element(s) can be placed anywhere within the feedback path. The preferred embodiment utilizes oscillation detector 70 to compare the output level of a pair of filters. One filter is essentially a duplicate of feedback network 14 and can in fact be the same filter. The second filter 71 has a slightly wider bandwidth such that its passband encompasses the band edges of feedback network 14. It is at these edges that loop oscillation is most likely to occur because of the rapid change in phase encountered there. Peaking will occur at the band edges prior to oscillation and this peaking can be detected by comparing the power output of the two filters. FIG. 4B illustrates a simplified spectral representation of the output of amplifier 12 as might appear after oscillation detector 70 has stabilized the loop gain to where moderate peaking is present. Bandwidths of feedback network 14 and filter 71 are denoted respectively as 80 and 81. Element 82 represents the fed back signal. As the level of peaking increases, the AGC control signal on input terminal 72 causes the gain of vector controller 30 to decrease. Comparison threshold and AGC time constants are set within oscillation detector 70 using well known techniques such that only an acceptable amount of peaking will occur.

Figure 5A:
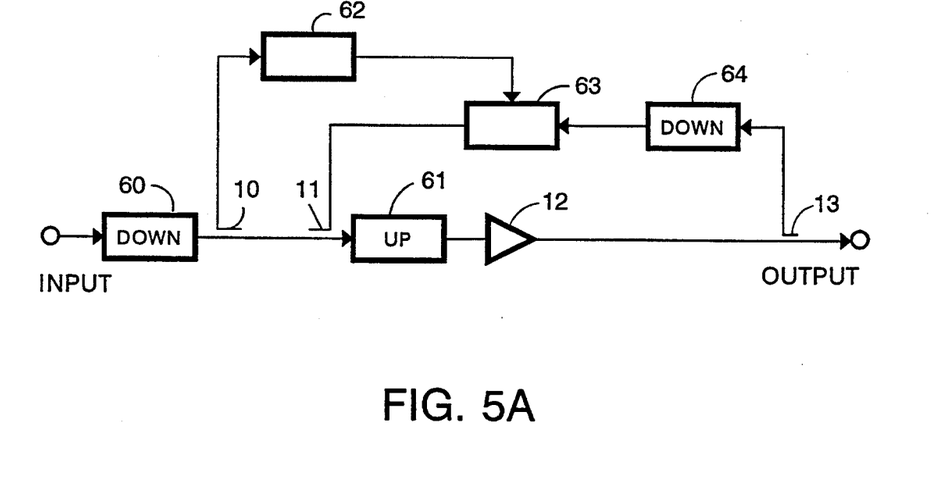
FIG. 5A and FIG. 5B show two intermediate frequency embodiments of the adaptive feedback system.
Figure 5B:
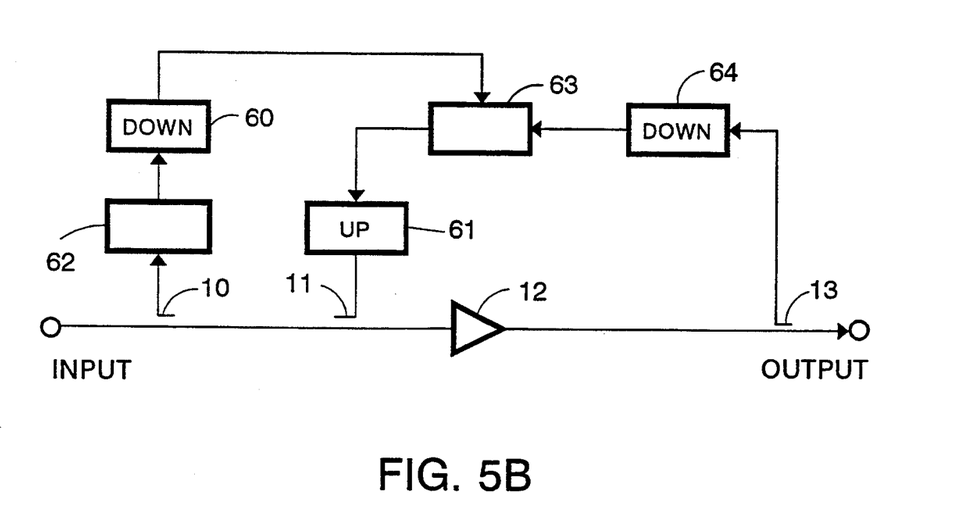

Depending on the operating frequency of the desired signal, it may be preferable to operate the feedback loop at an intermediate frequency. Such circumstances might arise for instance when it is difficult to implement the adaptive feedback system at the operating frequency due to component limitations or when the operating frequency varies such as is the case with frequency hopping systems. FIG. 5A and 5B illustrate use of up-/down conversion techniques to implement an intermediate frequency. It is assumed in these figures that the intermediate frequency is lower than the operating frequency; two down converters, 60 and 64, and one up converter 61 are used. Conversely, if the intermediate frequency is to be higher than the operating frequency, then the two down converters 60 and 64 are replaced with up converters and the single up converter 61 with a down converter. Up conversion might for example be used when amplifier 12 operates at audio frequencies and where it is advantageous to move feedback signal processing to a higher frequency in order to use broadband components such as the quadrature hybrids. Element 62 generally represents those circuits contained in the reference path, if any, and might, for example, include filter 19 or reference generator 50. Similarly element 63 generally represents those circuits contained in the feedback path and includes, for example, vector detector 20 and vector controller 30. Care must be taken in the design of converters 61 and 64 so that they will not destabilize closed loop operation through addition of excessive loop delay. Such delay is frequently a problem in feedback systems and becomes particularly troublesome at microwave frequencies. A principal source of delay in frequency converters is the image filter which follows the mixer; this source of delay can be eliminated if image rejection mixers (also known as SSB mixers) are used to suppress generation of image frequencies. Separate local oscillators can be used to drive the frequency converters but use of a common local oscillator is preferred as it simplifies the task of shifting the intermediate frequency such as might be required when tracking frequency hopping signals.

It will be appreciated that the adaptive feedback technique taught herein has very wide application in field of feedback control systems and is not restricted in any way to the suppression of distortion in amplifiers. In addition it will be appreciated that a feedback distortion compensated amplifier arrangement in accordance with the present invention may itself serve as a main amplifier in further feedback and feed-forward loops. The above described embodiments and methods are furnished as illustrative of the principles of this invention and are not intended to define the only embodiments possible in accordance with my teaching. Rather, protection under the United States Patent Law shall be afforded to use not only to the specific embodiments shown but to those falling within the spirit and terms of my invention as defined by the following claims.

I claim:

1. An adaptive feedback apparatus for reducing distortion produced by an electrical device, comprising:
   an electrical device having an input signal and producing an output signal in response thereto, and
   an input coupler means having as its input said input signal, said input coupler means including means for dividing said input signal into a primary input signal and one or more secondary input signals, and
   a feedback coupler means having as its input said primary input signal, said feedback coupler means including means for combining with said primary input signal one or more negative feedback signals, the combined signal being provided to the input of said electrical device, and
   an output coupler means having as its input said output signal, said output coupler means including means for dividing said output signal into a primary output signal and one or more secondary output signals, and
   at least one means for derivation of one or more reference signals from said secondary input signals such that each of said reference signals contains a selected component of said input signal, and
   at least one combination of one of said negative feedback signals with one of said secondary output signals with one or more paired sets of vector controller means and vector detector means, and
   said vector controller means for subtractively combining with the secondary output signal associated with a particular combination a phase and amplitude adjusted replica of a one of said reference signals to produce the negative feedback signal associated with said particular combination, said adjustment in accordance with one or more control signals provided by the associated vector detector means, and
   said vector detector means for automatically generating said control signals by comparison of the reference signal with the negative feedback signal associated with said particular combination such that said selected component present in said reference signal is substantially canceled in the negative feedback signal associated with said particular combination, thereby permitting only distortion to be fed back to the input of said electrical device resulting in suppression of said distortion in said primary output signal.

2. The adaptive feedback apparatus of claim 1 wherein a plurality of said paired sets each use the same one of said reference signals thereby resulting in increased cancellation of said selected component in said associated negative feedback signal.

3. The adaptive feedback apparatus of claim 1 wherein a plurality of said paired sets each use a different one of said reference signals thereby resulting in substantial cancellation of a plurality of said selected components in said associated negative feedback signal.

4. The adaptive feedback apparatus of claim 1 wherein said combination further includes a feedback network means for general control of feedback loop transfer function.

5. The feedback network of claim 1 comprising a bandpass filter.

6. The adaptive feedback apparatus of claim 1, further including a feedback amplifier means for increasing gain of the feedback path.

7. The feedback apparatus of claim 1 wherein said input signal comprises a plurality of signal channels arriving on separate input lines, further comprising:
   a plurality of input coupler means each having as its input one of said signal channels, each of said input coupler means including means for dividing said input into a primary input signal and one or more secondary input signals, and
   a channel combiner means having as its inputs the primary input signals produced by said plurality of input coupler means, said channel combiner means including means for combining said primary input signals to produce the input to said feedback coupler.

8. The adaptive feedback apparatus of claim 1, further including intermediate frequency transformation means, comprising:
   an input-signal frequency-converter means for offsetting the frequency of said input signal from its operating frequency to an intermediate frequency, and
   a post-feedback frequency-converter means for offsetting frequency of the output of said feedback coupler from said intermediate frequency back to said operating frequency, and
   an output-signal frequency-converter means for offsetting frequency of said secondary output signal from its operating frequency to said intermediate frequency.

9. The adaptive feedback apparatus of claim 1, further including intermediate frequency transformation means, comprising:
   an output-signal frequency-converter means for offsetting frequency of said secondary output signal from its operating frequency to an intermediate frequency, and
   a feedback-signal frequency-converter means for offsetting the frequency of said negative feedback signal from said intermediate frequency back to said operating frequency prior to said feedback coupler means, and
   a reference-signal frequency-converter means for offsetting frequency of said reference signal from its operating frequency to said intermediate frequency.

10. An adaptive feedback apparatus for reducing distortion produced by an electrical device, comprising:
    an electrical device having an input signal and producing an output signal in response thereto, and
    a feedback coupler means having as its input said input signal, said feedback coupler means including means for combining with said input signal one or more negative feedback signals, the combined signal being provided to the input of said electrical device, and an output coupler means having as its input said output signal, said output coupler means including means for dividing said output signal into a primary output signal and one or more secondary output signals, and at least one reference signal generating means for generation of one or more reference signals, each of said reference signals being divided into a first and second portion, and at least one reference signal combining means for combining the first portion of one of said reference signals with one of said negative feedback signals, and at least one combination of one of said reference signal combining means with one of said secondary output signals with a paired set of vector controller means and vector detector means, and said vector controller means for adjusting phase of the secondary output signal associated with said combination to produce the negative feedback signal associated with the same combination, said adjustment in accordance with one or more control signals provided by the associated vector detector means, and said vector detector means for automatically generating said control signals such that a selected spectral portion of said secondary output signal is negatively fed back thereby resulting in suppression of a corresponding spectral portion of said primary output signal.

11. The adaptive feedback apparatus of claim 10 wherein one or more of said vector detector means generates its control signals by comparison of the second portion of the reference signal and the secondary output signal associated with said particular combination.

12. The adaptive feedback apparatus of claim 10 wherein one or more of said vector detector means generates its control signals based on the level of the secondary output signal associated with said particular combination.

13. The adaptive feedback apparatus of claim 10 wherein said combination further includes a feedback network means for general control of feedback loop transfer function.

14. The feedback network of claim 13 comprising a bandpass filter.

15. The adaptive feedback apparatus of claim 10, further including intermediate frequency transformation means, comprising:

an input-signal frequency-converter means for offsetting the frequency of said input signal from its operating frequency to an intermediate frequency, and a post-feedback frequency-converter means for offsetting frequency of the output of said feedback coupler from said intermediate frequency back to said operating frequency, and an output-signal frequency-converter means for offsetting frequency of said secondary output signal from its operating frequency to said intermediate frequency.

16. The adaptive feedback apparatus of claim 10, further including intermediate frequency transformation means, comprising:

an output-signal frequency-converter means for offsetting frequency of said secondary output signal from its operating frequency to an intermediate frequency, and a feedback-signal frequency-converter means for offsetting the frequency of said negative feedback signal from said intermediate frequency back to said operating frequency prior to said feedback coupler means, and a reference-signal frequency-converter means for offsetting frequency of said reference signal from its operating frequency to said intermediate frequency.

17. A method for cancelling a selected signal from a closed-loop control system, the closed-loop control system comprising an input signal, an element modifying the input signal, an output signal, and a feedback path, the method comprising the steps of:

providing a selected signal to the feedback path;
comparing the selected signal with a feedback signal derived from the feedback path;
deriving from the comparison one or more control signals;
applying the control signals to the selected signal, thereby deriving a cancellation signal; and
feeding back a combination of the feedback signal and the cancellation signal into the modifying element.

18. The method of claim 17 wherein the step of applying the control signals to the selected signal ensures that the phase of the cancellation signal is substantially opposed to the phase of a corresponding version of the selected signal present in the feedback signal.

19. The method of claim 17 further comprising the step of processing the feedback signal by a feedback network for general control of the feedback loop transfer function.

20. The method of claim 19 wherein the feedback network comprises a bandpass filter.

21. The method of claim 17 further comprising the steps of:

attenuating the feedback signal before the step of comparing the feedback signal with the selected signal, and
amplifying the feedback signal after the cancellation signal is added to the feedback signal.

22. The method of claim 17 wherein a vector detector generates the control signals.

23. The method of claim 22 wherein a vector controller uses the control signals to generate the cancellation signal.

24. A method for cancelling a selected signal from a closed-loop control system, the closed-loop control system comprising an input signal, an element modifying the input signal, an output signal and a feedback path, the method comprising the steps of:

providing a selected signal to the feedback path;
comparing the selected signal with a feedback signal derived from the feedback path;
deriving from the comparison one or more control signals;
applying the control signals to the feedback signal, thereby substantially cancelling the selected signal from the feedback signal; and after the selected signal has been cancelled from the feedback signal in the preceding step, feeding back the feedback signal into the modifying element.

25. The method of claim 24 wherein the selected signal is generated by a signal generator.

26. The method of claim 24 further comprising the steps of:
splitting the selected signal into two or more secondary selected signals;
adding one of the secondary selected signals to the feedback signal; and
comparing a different one of the secondary selected signals with the feedback signal, the comparison resulting in the control signals.

27. The method of claim 24 wherein a vector detector generates the control signals and a vector controller uses the control signals to adjust the phase of the feedback signal.

28. An apparatus for eliminating a selected signal from a feedback path of a closed-loop control system, the closed loop control system comprising an input signal, an element that modifies the input signal, an output signal and the feedback path, the apparatus comprising:
means for deriving one or more control signals by comparing the selected signal with a feedback signal derived from the feedback path;
means for generating a cancellation signal by applying the control signals to the selected signal;
signal adding means for generating a combination of the cancellation signal and the feedback signal;
signal coupler means for feeding back the combination of the cancellation signal and the feedback signal into the modifying element.

29. An apparatus for eliminating a selected signal from a feedback path of a closed-loop control system, the closed loop control system comprising an input signal, an element that modifies the input signal, an output signal and the feedback path, the apparatus comprising:
means for comparing the selected signal with a feedback signal derived from the feedback path;
means for deriving from the comparison one or more control signals;
signal cancellation means for applying the control signals to the feedback signal, thereby substantially cancelling the selected signal from the feedback signal; and
signal coupler means, coupled to the signal cancellation means, for feeding back the feedback signal into the modifying element.

30. The apparatus of claim 29 further comprising:
signal splitting means for splitting the selected signal into two or more secondary selected signals; and
signal adding means for adding one of the secondary selected signals to the feedback signal.

31. An apparatus for eliminating a selected signal from a feedback path of a closed-loop control system, the close loop control system comprising an input signal, an element that modifies the input signal, an output signal and the feedback path, the apparatus comprising:
means for comparing the selected signal with a feedback signal derived from the feedback path;
means for deriving from the comparison one or more control signals;
signal cancellation means for applying the control signals to the feedback signal, thereby substantially cancelling the selected signal from the feedback signal; and
signal coupler means, coupled to the signal cancellation means, for feeding back the feedback signal into the modifying element.

32. The apparatus of claim 31 further comprising:
signal splitting means for splitting the selected signal into two or more secondary selected signals; and
signal adding means for adding one of the secondary selected signals to the feedback signal.

* * * * *